: US008624654B2

United States Patent
Sasho et al.

(10) Patent No.: US 8,624,654 B2
(45) Date of Patent: Jan. 7, 2014

(54) AUTOMATIC STEP VARIABLE ATTENUATOR AND RADIO COMMUNICATION DEVICE

(75) Inventors: Noboru Sasho, Tokyo (JP); Naoto Yoshikawa, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/552,326

(22) Filed: Jul. 18, 2012

(65) Prior Publication Data

US 2013/0033316 A1 Feb. 7, 2013

(30) Foreign Application Priority Data

Aug. 4, 2011 (JP) ................................. 2011-171202

(51) Int. Cl.
*H03L 5/00* (2006.01)

(52) U.S. Cl.
USPC ....................................... 327/308; 455/127.2

(58) Field of Classification Search
USPC ........................................ 327/308; 455/127.2
See application file for complete search history.

(56) References Cited

U.S. PATENT DOCUMENTS

| 5,204,976 | A | 4/1993 | Baldwin et al. |
| 6,590,437 | B2 | 7/2003 | Imai |
| 7,205,817 | B1 | 4/2007 | Huang et al. |
| 2007/0176665 | A1 * | 8/2007 | Zhang et al. .................. 327/308 |

FOREIGN PATENT DOCUMENTS

JP 2000-286654 A 10/2000

OTHER PUBLICATIONS

Dmitriy Rozenblit, Darioush Agahi, Gain Control Systems and Methods for Controlling and Adjustable Power Level, Oct. 6, 2011, WO2011/123100, Figure 1.*
Extended European Search Report issued Nov. 19, 2012 for corresponding European Application No. 12175138.2-1233.

* cited by examiner

*Primary Examiner* — John Poos
(74) *Attorney, Agent, or Firm* — Sony Corporation

(57) ABSTRACT

An automatic step variable attenuator includes: a step variable attenuator attenuating a received signal of an electric wave signal in an attenuation amount corresponding to a control signal in a step-like style; a detector disposed in parallel with the step variable attenuator for input of the received signal of the electric wave signal, and converting an electric power of the received signal thus inputted into an intensity signal representing an intensity of the received signal; and a comparator portion generating the control signal corresponding to a result of comparison for differences between the intensity signal obtained from the detector and plural threshold values, and outputting the control signal thus generated to the step variable attenuator.

10 Claims, 8 Drawing Sheets

| ATTENUATION VALUE | Vc1 | Vc2 | Vc3 | Vc4 |
|---|---|---|---|---|
| 0dB | H | H | H | H |
| 5dB | L | H | H | H |
| 10dB | L | L | H | H |
| 15dB | L | L | L | H |
| 20dB | L | L | L | L |

AUTOMATIC STEP VARIABLE ATTENUATOR AND RADIO COMMUNICATION DEVICE

BACKGROUND

The present disclosure relates to an automatic step variable attenuator which is capable of being applied to a front-end portion in a receiver of either a radio communication device or a television (TV) system, and a radio communication device to which the automatic step variable attenuator is applied.

For the purpose of enabling an RF received signal having a wide range to be received, a radio receiver includes a variable gain function.

Normally, for enabling the range to be obtained as largely as possible, the variable function is not consolidated into one element, but is dispersed into plural elements in many cases.

The variable gain functional element is roughly classified into a variable gain amplifier and a variable attenuator depending on whether or not the variable gain functional element has a gain of one or more power.

In particular, the latter is normally high in linearity because it can be mainly composed of a passive element such as a resistive element or a switch. Thus, the latter is mounted to the front-end of the receiver, whereby a variable gain function is obtained without deteriorating a signal when an excessive RF received signal is inputted thereto.

For example, there is known a Low-IF type radio receiver including an element having three variable gain functions in a receiver signal path. In this case, an automatic step variable attenuator, a low-noise variable gain amplifier or an IF variable gain amplifier corresponds to the variable gain functional element.

An automatic gain controlling circuit in which the automatic step variable attenuator is mounted to the front-end portion of the receiver is known as this sort of technique. This sort of technique, for example, is disclosed in Japanese Patent Laid-Open No. 2000-286654.

SUMMARY

The known technique described above is configured as a feedback system in which a detector is mounted to a subsequent stage of a step attenuator in order to realize the automatic step variable function.

The feedback system has an advantage that a signal dynamic range in which the detector is operated has only to be small.

However in the circuit which is autonomously operated, the input of the RF signal to the detector is changed whenever the step is switched over to another one. Thus, time until stabilization of the output signal is required, and thus time until decision of the final step attenuation value from start of the operation has a tendency to become long.

For example, when the system described above is utilized in a terrestrial analog TV receiver, the attenuation value of the automatic step attenuator needs to be decided for a period of time required for the receiver channel setting (for this period of time, no output to a TV image is carried out because the initial setting such as the gain setting is carried out in the receiver and the demodulator in the subsequent stage).

When the switching is carried out in the step attenuator after completion of the channel setting, the noise is provided to the image, which is not preferable.

It is desirable to provide an automatic step variable attenuator in which time ranging from start of an operation to decision of a final step attenuation value can be shortened, and a radio communication device to which the automatic step variable attenuator is applied.

In order to attain the desire described above, according to an embodiment of the present disclosure, there is provided an automatic step variable attenuator including: a step variable attenuator attenuating a received signal of an electric wave signal in an attenuation amount corresponding to a control signal in a step-like style; a detector disposed in parallel with the step variable attenuator for input of the received signal of the electric wave signal, and converting an electric power of the received signal thus inputted into an intensity signal representing an intensity of the received signal; and a comparator portion generating the control signal corresponding to a result of comparison for differences between the intensity signal obtained from the detector and plural threshold values, and outputting the control signal thus generated to said step variable attenuator.

According to another embodiment of the present disclosure, there is provided a radio communication device including: an automatic step variable attenuator attenuating a received signal of an electric wave signal in a step-like style; and a low-noise amplifier amplifying a received signal outputted from the automatic step variable attenuator with a predetermined gain, the automatic step variable attenuator including: a step variable attenuator attenuating the received signal of the electric wave signal in an attenuation amount corresponding to a control signal in a step-like style, and outputting the resulting received signal to the low-noise amplifier; a detector disposed in parallel with the step variable attenuator for input of the received signal of the electric wave signal, and converting an electric power of the received signal thus inputted into an intensity signal representing an intensity of the received signal; and a comparator portion generating the control signal corresponding to a result of comparison for differences between the intensity signal obtained from said detector and plural threshold values, and outputting the control signal thus generated to the step variable attenuator.

As set forth hereinabove, according to the present disclosure, it is possible to shorten the time ranging from start of the operation to decision of the final step attenuation value.

DETAILED DESCRIPTION OF THE PREFERRED EMBODIMENTS

Embodiments of the present disclosure will be described in detail hereinafter with reference to the accompanying drawings.

It is noted that the description will be given below in accordance with the following order.
1. First Embodiment: Radio Communication Device
2. Second Embodiment: Automatic Step Variable Attenuator
2-1. Configuration of Detector
2-2. Configuration of Step Variable Attenuator
2-3. Configuration of Reference Voltage Generating Portion
2-4. Configuration of Hysteresis Comparator Portion
2-5. Configuration of Upper Side (High-Level Side) Threshold Shifting Functional Portion
1. First Embodiment: Radio Communication Device FIG. 1 is a circuit diagram, partly in block, showing a configuration of a radio communication device according to a first embodiment of the present disclosure in which an automatic step variable attenuator according to a second embodiment of the present disclosure is adopted.

Figure 1:
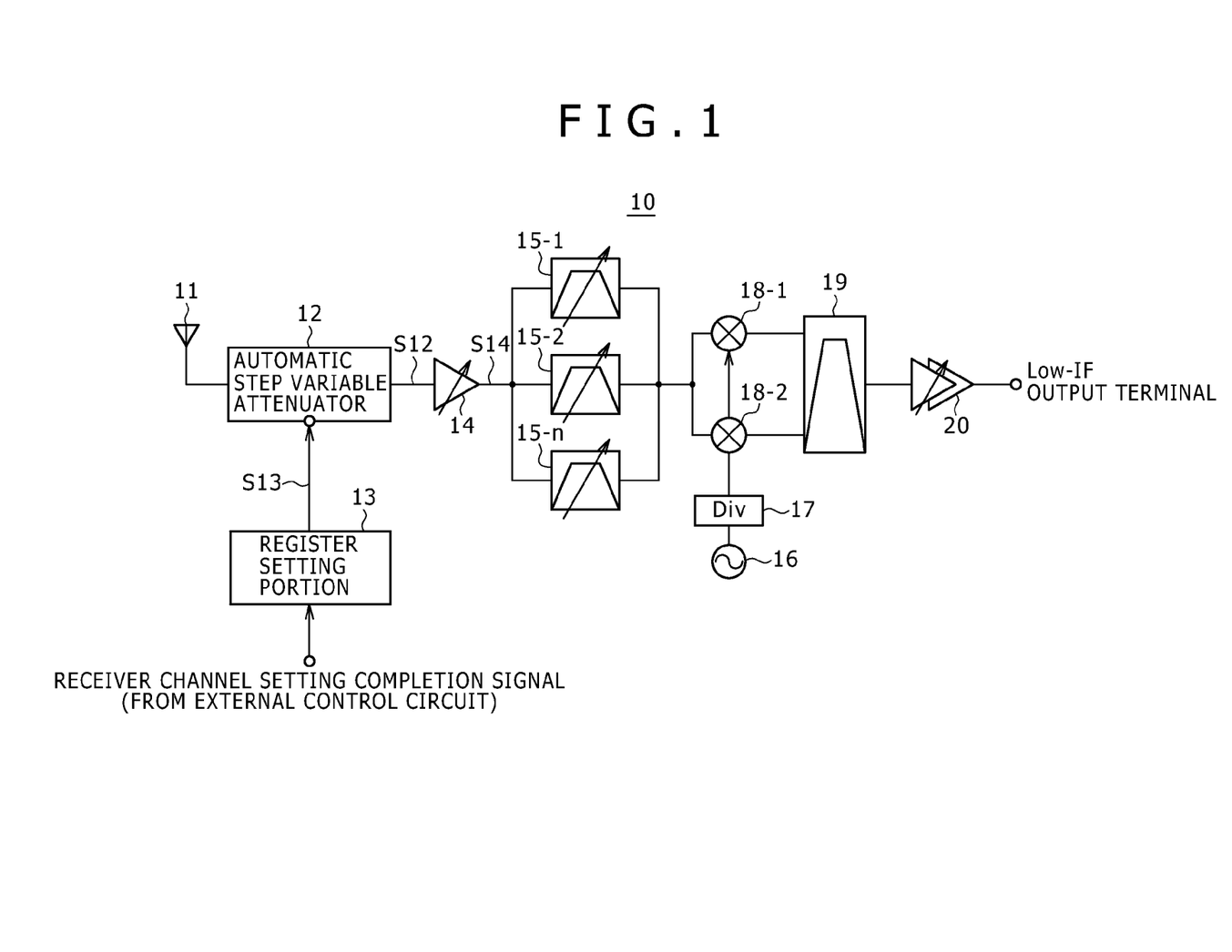
FIG. 1 is a circuit diagram, partly in block, showing a configuration of a radio communication device according to a first embodiment of the present disclosure in which an automatic step variable attenuator according to a second embodiment of the present disclosure is adopted.

The radio communication device 10 of the first embodiment of FIG. 1 shows, as an example, a configuration of a front-end portion of a Low-IF type tuner as a radio receiver.

The radio communication device 10, as shown in FIG. 1, includes an antenna 11, the automatic step variable attenuator 12, a register setting portion 13, a low-noise variable amplifier (LNA) 14, and band-pass filters (BPFs) 15-1 to 15-n (n=3 in FIG. 1).

The radio communication device 10 further includes a local oscillator 16, a frequency divider 17, mixers 18-1 and 18-2, a polyphase filter 19, and an IF variable gain amplifier 20.

Thus, the radio communication device 10 is configured so as to include the three variable gain elements: the automatic step variable attenuator 12; the low-noise variable amplifier 14; and the IF variable gain amplifier 20.

The radio communication device 10, for example, has a variable gain dynamic range of 80 dB or more by utilizing the three variable gain elements. Thus, the radio communication device 10 can maintain the optimal output level for an input signal level having a wide range.

In addition, the automatic step variable attenuator 12 composed of a passive element is mounted to an input portion of the radio communication device 10. As a result, when a large interfering wave is inputted, a signal inputted to the low-noise variable amplifier 14 composed of an active element which is easy to generate a distortion can be reduced without generating any of the distortions.

The automatic step variable attenuator 12 automatically selects an optimal attenuator amount corresponding to both of a received signal electric power and the interfering wave electric power, attenuates a radio received signal (RF signal) received at the antenna 11 with the attenuation amount thus selected, and outputs the resulting attenuated signal S12 to the low-noise variable amplifier 14.

The automatic step variable attenuator 12 has a function with which the attenuation amount is not perfectly fixed after completion as well of reception initial setting, and switches the threshold over to another one after completion of reception processing setting (such as channel switching) to prevent an unnecessary step switching operation during the receiving operation.

The automatic step variable attenuator 12 has a function of shifting an upper side (high-level side) threshold in response to an upper side threshold shift signal S13 corresponding to a receiver channel setting completion signal set in the register setting portion 13. It is noted that the receiver channel setting completion signal is supplied from an external control system to the automatic step variable attenuator 12.

A concrete configuration and function of the automatic step variable attenuator 12 will be described in detail later.

The low-noise variable amplifier 14 amplifies the output signal S12 from the automatic step variable attenuator 12 with a predetermined gain, and outputs the resulting signal S14 thus amplified to each of the BPFs 15-1 to 15-n (n=3 in FIG. 1).

The BPFs 15-1 to 15-n extract signals having predetermined frequency bands, respectively, from the output signal S14 from the low-noise variable amplifier 14, and output the signals thus extracted to the mixers 18-1 and 18-2.

The mixers 18-1 and 18-2 mix the output received signals from BPFs 15-1 to 15-n, and an oscillation signal of the local oscillation 16 with each other to generate an intermediate frequency signal (IF signal), and outputs the IF signal thus generated to the polyphase filter 19.

The polyphase filter 19 removes away any of unnecessary components of the IF signal, and outputs the resulting IF signal to the IF variable gain amplifier 20.

The IF variable gain amplifier 20 amplifies the IF signal with a predetermined gain.
2. Second Embodiment: Automatic Step Variable Attenuator Next, a description will be given with respect to a concrete configuration and function of the automatic step variable attenuator 12 according to the second embodiment of the present disclosure.

Figure 2:
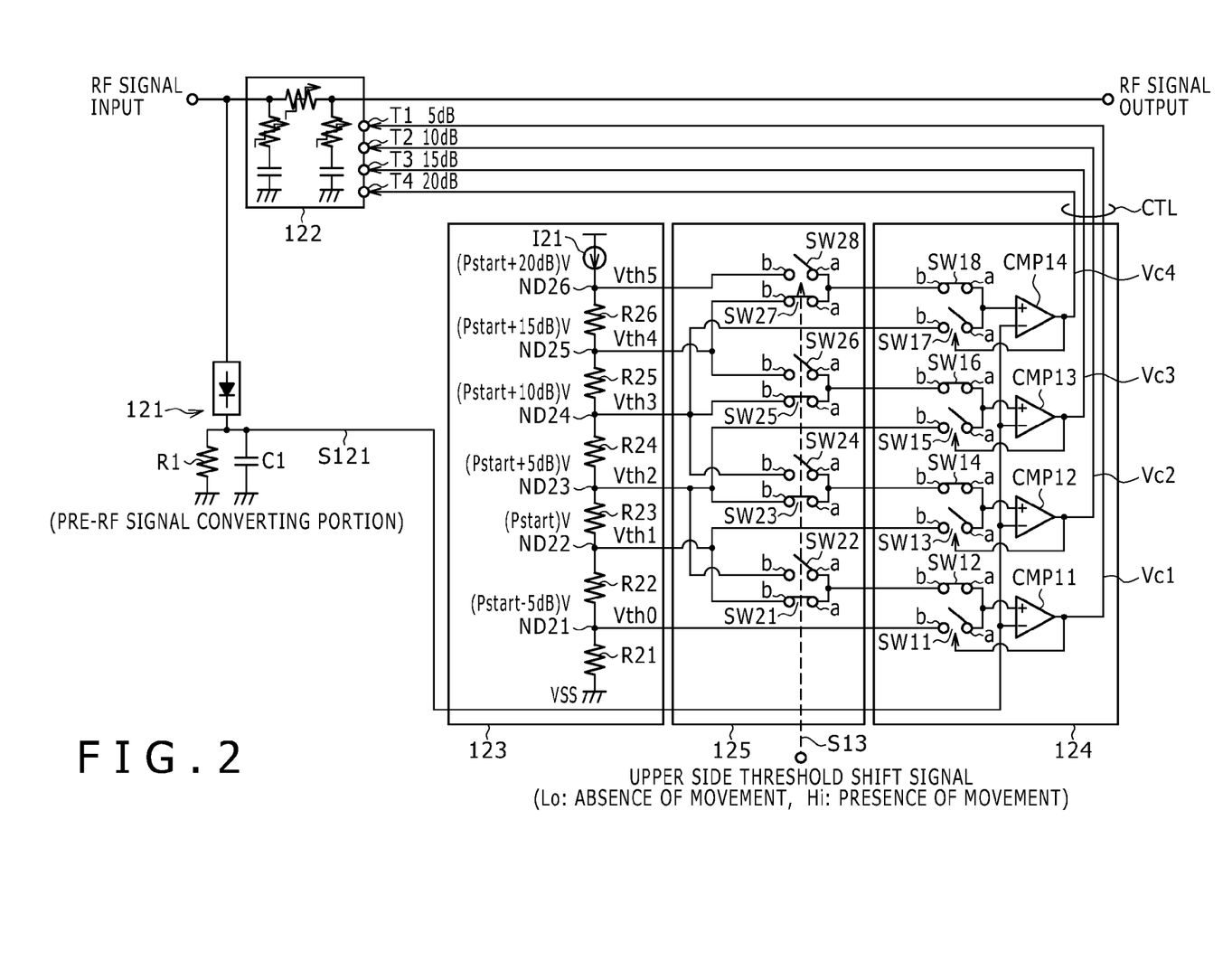
FIG. 2 is a circuit diagram showing a configuration of the automatic step variable attenuator according to the second embodiment of the present disclosure.

FIG. 2 is a circuit diagram showing a configuration of the automatic step variable attenuator 12 according to the second embodiment of the present disclosure.

The automatic step variable attenuator 12, as shown in FIG. 2, includes a detector 121, a step variable attenuator 122, a reference voltage generating portion 123, a hysteresis comparator portion 124, and an upper side (high-level side) threshold shifting functional portion 125.
2-1. Configuration of Detector The detector 121 is disposed in parallel with the step variable attenuator 122 in relation to input of an electric wave received signal (RF signal) (disposed in a preceding stage of the step variable attenuator 122), and converts an electric power of the RF signal (electric wave signal) thus inputted into an intensity signal representing an intensity of such a voltage.

The detector 121 outputs the voltage signal S121 obtained through the conversion to the hysteresis comparator portion 124.

The detector 121 generates the resulting signal (intensity signal) S121 corresponding to a time constant of a resistive element R1 and a capacitor C1.

Figure 3:
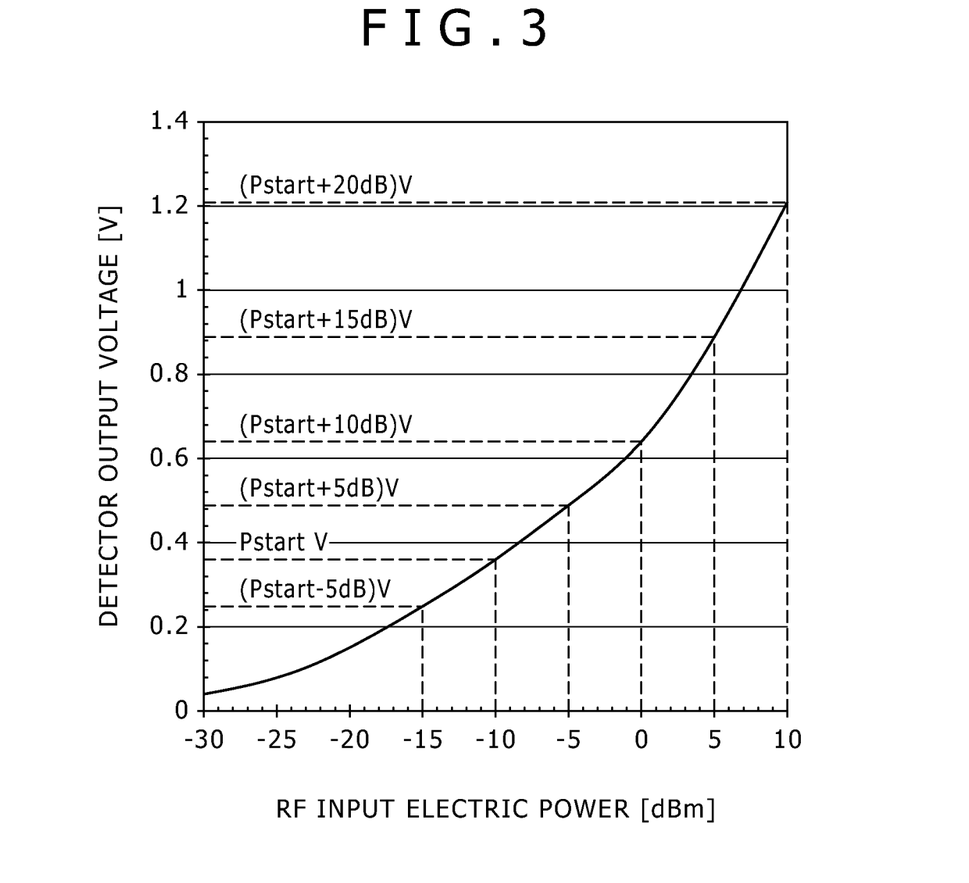
FIG. 3 is a graph showing input/output characteristics of a detector in the automatic step variable attenuator according to the second embodiment of the present disclosure.

FIG. 3 is a graph representing input/output characteristics of the detector in the automatic step variable attenuator 12 according to the second embodiment of the present disclosure.

In FIG. 3, an axis of abscissa represents an RF input electric potential [dBm], and an axis of ordinate represents an output voltage [V] from the detector 121.

As shown in FIG. 3, the voltage signal S121 is outputted from the detector 121 in correspondence to the electric power of the RF signal so as to be monotonously increased.

The detector 121 shows an operation in which the output voltage from the detector 121 becomes approximately 0 V before application of the RF signal, and is increased from the moment the RF signal is inputted in accordance with the built-in time constant.

Since in the second embodiment, a feedback system is not adopted, the RF signal inputted to the detector 121 is not changed in a step-like style.

The time constant of the detector 121 is selected as a suitable value in such a way that all of the operations for setting the suitable attenuation value of the step variable attenuator 122 are completed for a receiver channel setting period of time.

2-2. Configuration of Step Variable Attenuator

The step variable attenuator 122 attenuates the RF signal (received signal) in a step-like style in accordance with a control signal CTL which is supplied as a feed forward system signal from the hysteresis comparator portion 124.

The step variable attenuator 122 in the second embodiment, as an example, is configured as a variable attenuator for carrying out switching in five stages at a step of 5 dB.

The step variable attenuator 122 carries out the switching in the five stages at a step of 5 dB: 5 dB; 10 dB; 15 dB; and 20 dB with 0 dB as a reference as the attenuation value in accordance with the control signal CTL.

The step variable attenuator 122 includes control terminals T1 to t4.

The reason why the four control terminals T1 to t4 are disposed in the step variable attenuator 122 because as an example, the control signal CTL supplied from the hysteresis comparator 124 contains four (4-bits) signals Vc1 to Vc4.

The control signal Vc1 is supplied to the control terminal T1 and the control signal Vc2 is supplied to the control terminal T2. Also, the control signal Vc3 is supplied to the control terminal T3 and the control signal Vc4 is supplied to the control terminal T4.

Figure 4:
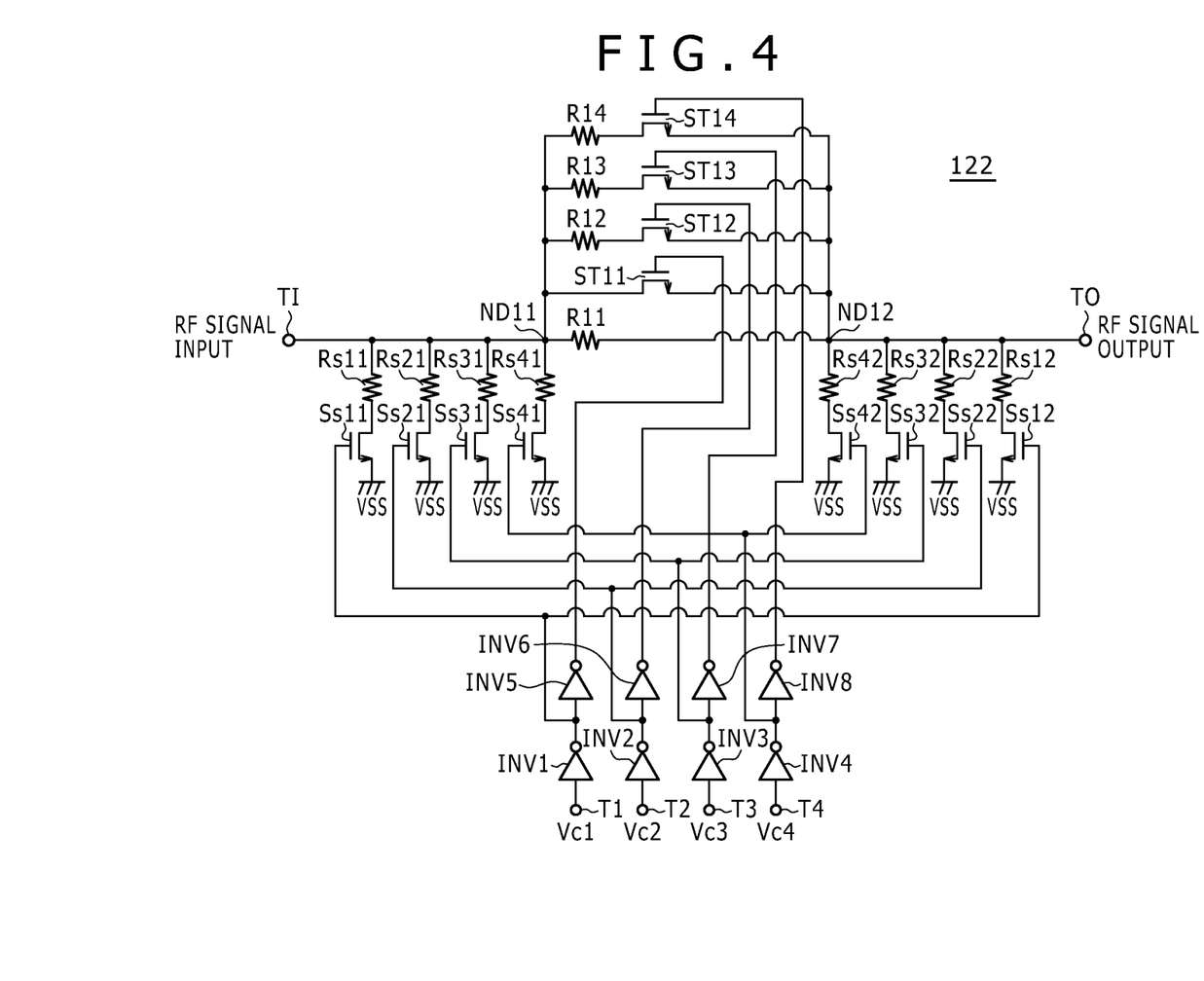
FIG. 4 is a circuit diagram showing a configuration of a step variable attenuator in the automatic step variable attenuator according to the second embodiment of the present disclosure.

FIG. 4 is a circuit diagram showing a configuration of the step variable attenuator in the second embodiment.

The step variable attenuator 122 shown in FIG. 4 includes resistive elements R11 to R14, resistive elements Rs11, Rs12, Rs21, Rs22, Rs31, Rs32, Rs41, and Rs42, and nodes ND11 and ND12.

The step variable attenuator 122 includes switching transistors ST11 to ST14, and switching transistors Ss11, Ss12, Ss21, Ss22, Ss31, Ss32, Ss41, and Ss42 each composed of an N-channel field effective transistor (EFT).

Also, the step variable attenuator 122 includes inverters INV1 to INV8, an input terminal TI for the RF signal, and an output terminal TO for the RF signal.

The inverters INV1 and INV5 are connected in series with the control terminal T1, and the inverters INV2 and INV6 are connected in series with the control terminal T2. Also, the inverters INV3 and INV7 are connected in series with the control terminal T3, and the inverters INV4 and INV8 are connected in series with the control terminal T4.

The node ND11 is connected to the input terminal T1, and the node ND12 is connected to the output terminal TO. Also, one terminal of the resistance element R11 is connected to the node ND11, and the other terminal of the resistance element R11 is connected to the node ND12.

A drain terminal of the switching transistor ST11 is connected to the node ND11, a source terminal thereof is connected to the node ND12, and a gate terminal thereof is connected to an output terminal of the inverter INV5.

One terminal of the resistive element R12 is connected to the node ND11, and the other terminal thereof is connected to a drain terminal of the switching transistor ST12. A source terminal of the switching transistor ST12 is connected to the node ND12, and a gate terminal thereof is connected to an output terminal of the inverter INV6.

One terminal of the resistive element R13 is connected to the node ND11, and the other terminal thereof is connected to a drain terminal of the switching transistor ST13. A source terminal of the switching transistor ST13 is connected to the node ND12, and a gate terminal thereof is connected to an output terminal of the inverter INV7.

One terminal of the resistive element R14 is connected to the node ND11, and the other terminal thereof is connected to a drain terminal of the switching transistor ST14. A source terminal of the switching transistor ST14 is connected to the node ND12, and a gate terminal thereof is connected to an output terminal of the inverter INV8.

One terminal of the resistive element Rs11 is connected to each of the node ND11 and the input terminal TI, and the other terminal thereof is connected to a drain terminal of the switching transistor Ss11. A source terminal of the switching transistor Ss11 is connected to a reference electric potential VSS (the grounding electric potential GND in this case), and a gate terminal thereof is connected to an output terminal of the inverter INV1.

One terminal of the resistive element Rs12 is connected to each of the node ND12 and the output terminal TO, and the other terminal thereof is connected to a drain terminal of the switching transistor Ss12. A source terminal of the switching transistor Ss12 is connected to the reference electric potential VSS (the grounding electric potential GND in this case), and the gate terminal thereof is connected to the output terminal of the inverter INV1.

One terminal of the resistive element Rs21 is connected to each of the node ND11 and the input terminal TI, and the other terminal thereof is connected to a drain terminal of the switching transistor Ss21. A source terminal of the switching transistor Ss21 is connected to the reference electric potential VSS (the grounding electric potential GND in this case), and the gate terminal thereof is connected to the output terminal of the inverter INV2.

One terminal of the resistive element Rs22 is connected to each of the node ND12 and the output terminal TO and the other terminal thereof is connected to a drain terminal of the switching transistor Ss22. A source terminal of the switching transistor Ss22 is connected to the reference electric potential VSS (the grounding electric potential GND in this case), and the gate terminal thereof is connected to the output terminal of the inverter INV2.

One terminal of the resistive element Rs31 is connected to each of the node ND11 and the output terminal TI, and the other terminal thereof is connected to a drain terminal of the switching transistor Ss31. A source terminal of the switching transistor Ss31 is connected to the reference electric potential VSS (the grounding electric potential GND in this case), and the gate terminal thereof is connected to an output terminal of the inverter INV3.

One terminal of the resistive element Rs32 is connected to each of the node ND12 and the output terminal TO, and the other terminal thereof is connected to a drain terminal of the switching transistor Ss32. A source terminal of the switching transistor Ss32 is connected to the reference electric potential VSS (the grounding electric potential GND in this case), and the gate terminal thereof is connected to the output terminal of the inverter INV3.

One terminal of the resistive element Rs41 is connected to each of the node ND11 and the input terminal TI, and the other terminal thereof is connected to a drain terminal of the switching transistor Ss41. A source terminal of the switching transistor Ss41 is connected to the reference electric potential VSS (the grounding electric potential GND in this case), and a gate terminal thereof is connected to an output terminal of the inverter INV4.

One terminal of the resistive element Rs42 is connected to each of the node ND12 and the output terminal TO, and the other terminal thereof is connected to a drain terminal of the switching transistor Ss42. A source terminal of the switching transistor Ss42 is connected to the reference electric potential VSS (the grounding electric potential GND in this case), and a gate terminal thereof is connected to the output terminal of the inverter INV4.

The step variable attenuator 122 shown in FIG. 4 composes a so-called π type resistive attenuator. Thus, a suitable resistive value is selected in such a way that in any state, an input impedance becomes constant and an attenuation amount is obtained in a 5 dB step style.

Figure 5:
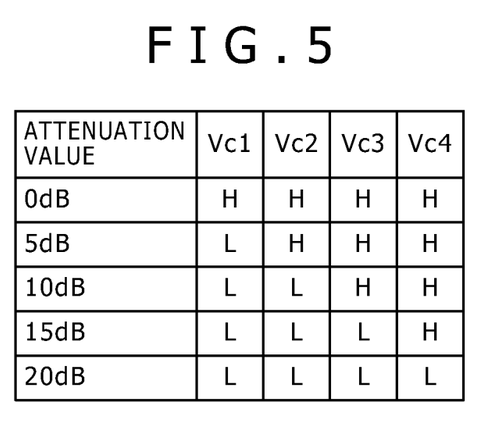
FIG. 5 is a diagram showing an example of correspondence between a control signal of the step variable attenuator shown in FIG. 4, and an attenuation area.

FIG. 5 is a diagram showing an example of correspondence between the control signals of the step variable attenuator shown in FIG. 4, and attenuation areas.

In FIG. 5, "H" represents a High level (logic 1) at which the switching transistor is caused to conduct (is turned ON), and "L" represents a Low level (logic 0) at which the switching transistor becomes non-conduction (is turned OFF). In the second embodiment, an H level corresponds to a first level, and an L level corresponds to a second level.

When the control signals Vc1, Vc2, Vc3, and Vc4 supplied to the control terminals T1 to T4, respectively, are set at H, H, H, and H levels, each of the output signals from the inverters INV1 to INV4 becomes the L level, and each of the output signals from the inverters INV5 to INV8 becomes the H level. As a result, the switching transistors ST11 (ST12 to ST14) is (are each) turned ON, and the switching transistors Ss11 to Ss42 are each turned OFF.

In this case, a bypass state is provided in which the input terminal TI and the output terminal TO are connected to each other through the switching transistor(s) ST11, and thus the attenuation value is 0 dB.

When the control signals Vc1, Vc2, Vc3, and Vc4 supplied to the control terminals T1 to T4 are set at the L, H, H, and H levels, respectively, each of the input signals from the inverters INV2 to INV4, and INV5 becomes the L level and each of the output signals from the inverters INV1, and INV6 to INV8 becomes the H level. As a result, the switching transistors ST12 to ST14, Ss11, and Ss12 are each turned ON, and the switching transistors ST11, and Ss21 to Ss42 are each turned OFF.

In this case, the resistive elements R12 to R14, Rs11, and Rs12 compose the π type resistive attenuator, and thus the attenuation value becomes 5 dB.

When the control signals Vc1, Vc2, Vc3, and Vc4 supplied to the control terminals T1 to T4 are set at the L, L, H, and H levels, respectively, the following states are obtained.

In this case, each of the output signals from the inverters INV3, INV4, INV5, and INV6 becomes the L level, and each of the output signals from the inverters INV1, INV2, INV7, and INV8 becomes the H level. As a result, the switching transistors ST13, ST14, Ss11, Ss12, Ss21, and Ss22 are each turned ON, and the switching transistors ST11, ST12, and Ss31 to Ss42 are each turned OFF.

In this case, the resistive elements R13, R14, Rs11, Rs12, Rs21, and Rs22 compose the π type resistive attenuator, and thus the attenuation value becomes 10 dB.

When the control signals Vc1, Vc2, Vc3, and Vc4 supplied to the control terminals T1 to T4 are set at the L, L, L, and H levels, respectively, the following states are obtained.

In this case, each of the output signals from the inverters INV4, INV5, INV6, and INV7 becomes the L level, and each of the output signals from the inverters INV1, INV2, INV3, and INV8 becomes the H level. As a result, the switching transistors ST14, Ss11, Ss12, Ss21, Ss22, Ss31, and Ss32 are each turned ON, and the switching transistors ST11, ST12, ST13, Ss41, and Ss42 are each turned OFF.

In this case, the resistive elements R14, Rs11, Rs12, Rs21, Rs22, Rs31, and Rs32 compose the π type resistive attenuator, and thus the attenuation value becomes 15 dB.

When the control signals Vc1, Vc2, Vc3, and Vc4 supplied to the control terminals T1 to T4 are set at the L, L, L, and L levels, respectively, the following states are obtained.

In this case, each of the output signals from the inverters INV5, INV6, INV7, and INV8 becomes the L level, and each of the output signals from the inverters INV1, INV2, INV3, and INV4 becomes the H level. As a result, the switching transistors Ss11, Ss12, Ss21, Ss22, Ss31, Ss32, Ss41, and Ss42 are each turned ON, and the switching transistors ST11, ST12, ST13, and ST14 are each turned OFF.

In this case, the resistive elements Rs11, Rs12, Rs21, Rs22, Rs31, Rs32, Rs41, and Rs42 compose the π type resistive attenuator, and thus the attenuation value becomes 20 dB.

In such a way, the step variable attenuator 122 shown in FIG. 4 carries out the operation having the five states shown in FIG. 5.

With the step variable attenuator 122, even when the RF input signal having the excessively large magnitude is inputted to the system, the level of the signal which is outputted to the low-noise variable amplifier 14 in the subsequent stage is adjusted in the range within 5 dB in the step variable range.

2-3. Configuration of Reference Voltage Generating Portion

The reference voltage generating portion 123 generates the threshold voltages Vth0, and Vth1 to Vth5 each serving as a reference voltage used to give a comparison voltage to the hysteresis comparator portion 124.

The reference voltage generating portion 123, as shown in FIG. 2, includes a current source I21, resistive elements R21 to R26, and nodes ND21 to ND26. In this case, the current source I21 is connected to a power source side. Also, the resistive elements R21 to R26 are connected in series between the current source I21 and the reference electric potential VSS (the grounding electric potential GND).

In the reference voltage generating portion 123, the node ND21 is composed of a connection point between the resistive element R21 and the resistive element R22. Also, the node ND22 is composed of a connection point between the resistive element R22 and the resistive element R23.

The node ND23 is composed of a connection point between the resistive element R23 and the resistive element R24, and the node ND24 is composed of a connection point between the resistive element R24 and the resistive element R25.

The node ND25 is composed of a connection point between the resistive element R25 and the resistive element R26, and the node ND26 is composed of a connection point between the resistive element R26 and the current source I21.

The reference voltage generating portion 123 generates the first threshold voltage Vth1 as a voltage PstartV with which electric power detection is started in the hysteresis comparator portion 124 in the node ND22 through the series resistor.

The reference voltage generating portion 123 generates the second threshold voltage Vth2 as a voltage (PstartV+5 dB) corresponding to a voltage which is 5 dB higher than the voltage PstartV with which the electric power detection is started in the hysteresis comparator portion 124 in the node ND23 through the series resistor.

The reference voltage generating portion 123 generates the third threshold voltage Vth3 as a voltage (PstartV+10 dB) corresponding to a voltage which is 10 dB higher than the voltage PstartV with which the electric power detection is started in the hysteresis comparator portion 124 in the node ND24 through the series resistor.

The reference voltage generating portion 123 generates the fourth threshold voltage Vth4 as a voltage (PstartV+15 dB) corresponding to a voltage which is 15 dB higher than the voltage PstartV with which the electric power detection is started in the hysteresis comparator portion 124 in the node ND25 through the series resistor.

The reference voltage generating portion 123 generates the fifth threshold voltage Vth5 as a voltage (PstartV+20 dB) corresponding to a voltage which is 20 dB lower than the voltage PstartV with which the electric power detection is started in the hysteresis comparator portion 124 in the node ND26 through the series resistor.

The reference voltage generating portion 123 generates the zero-th threshold voltage Vth0 as a voltage (PstartV−5 dB) corresponding to a voltage which is 5 dB lower than the voltage PstartV with which the electric power detection is started in the hysteresis comparator portion 124 in the node ND21 through the series resistor.

The reference voltage generating portion 123 outputs the zero-th to fifth threshold voltages Vth0 to Vth5 thus generated to the hysteresis comparator portion 124 through the upper side threshold shifting functional portion 125.

2-4. Configuration of Hysteresis Comparator Portion

The hysteresis comparator portion 124 generates the control signals CTLs (Vc1 to Vc4) corresponding to results of comparison between the voltage signal S121 which is basically monotonously increased and which is detected by the detector 121, and the threshold voltages Vth1 to Vth5 (Vth0) supplied thereto. The hysteresis comparator portion 124 outputs the control signals Vc1 to Vc4 thus generated to the step variable attenuator 122.

The hysteresis comparator portion 124 includes plural comparators which compare the threshold voltages Vth2 to Vth5, and the voltage signal S121 with each other in order from the lowest threshold voltage Vth1, and the voltage signal S121.

The hysteresis comparator portion 124 switches the comparison starting threshold voltage used in the first comparison from the comparator which compares the lowest threshold voltage Vth1 with the voltage signal S121 and whose output signal is inverted over to the threshold voltage which, for example, is 5 dB lower than the comparison starting threshold voltage, thereby carrying out the comparing operation.

The hysteresis comparator portion 124 shown in FIG. 2 includes comparators CMP11 to CMP14, and switches SW11 to SW18.

The comparator CMP11 outputs the control signal Vc1 set at either the H level or the L level, and the comparator CMP12 outputs the control signal Vc2 set at either the H level or the L level.

The comparator CMP13 outputs the control signal Vc3 set at either the H level or the L level, and the Comparator CMP14 outputs the control signal Vc4 set at either the H level or the L level.

An inverting input terminal (−) of the comparator CMP11 is connected to a supply line for the voltage signal S121 by the detector 121, and a non-inverting input terminal (+) thereof is connected to a terminal, a, of each of the switch SW11 and the switch SW12.

A terminal, b, of the switch SW11 is connected to the node ND21 of the reference voltage generating portion 123. That is to say, the zero-th threshold voltage Vth0 as the voltage (PstartV−5 dB) corresponding to the voltage which is 5 dB lower that the voltage PstartV with which the electric power detection is started is supplied to the terminal, b, of the switch SW11.

The terminal, b, of the switch SW12 is connected to either the node ND22 or the node ND23 of the reference voltage generating portion 123 through the upper side threshold shifting functional portion 125.

That is to say, either the first threshold voltage Vth1 as the voltage PstartV with which the electric power detection is started or the second threshold voltage Vth2 as the voltage (PstartV+5 dB) corresponding to the voltage which is higher than the start voltage PstartV is supplied to the terminal, b, of the switch SW12.

The switches SW11 and SW12 are each turned ON or OFF in a complementary style in accordance with the output signal from the comparator CMP11. Specifically, the switch SW12 is turned ON and the switch SW11 is turned OFF when the output control signal Vc1 from the comparator CMP11 is set at the H level. On the other hand, the switch SW12 is turned OFF and the switch SW11 is turned ON when the output control signal Vc1 from the comparator CMP11 is set at the L level.

In a phase of start of the detection, the comparator CMP11 compares the voltage signal S121 supplied to the inverting input terminal (−) thereof, and the first threshold voltage Vth1 supplied to the non-inverting input terminal (+) thereof with each other.

The comparator CMP11 outputs the control signal Vc1 set at the H level when the voltage signal S121 is lower than the first threshold voltage Vth1, and outputs the control signal Vc1 set at the L level when the voltage signal S121 is increased to exceed the first threshold voltage Vth1.

As a result, the switch SW12 is turned OFF, and the switch SW11 is turned ON.

The comparator CMP11 carries out an operation for comparing the zero-th threshold voltage Vth0 as the voltage (PstartV−5 dB) corresponding to the voltage which is 5 dB lower than the voltage PstartV with which the electric power detection is started, and the voltage signal S121 with each other after the level of the output signal has been inverted. The comparing operation using the zero-th threshold voltage Vth0 is continuously carried out until the voltage signal S121 becomes lower than the zero-th threshold voltage Vth0 and as a result, the level of the output signal from the comparator CMP11 is switched over to the H level.

An inverting input terminal (−) of the comparator CMP12 is connected to a supply line for the voltage signal S121 by the detector 121, and a non-inverting input terminal (+) thereof is connected to a terminal, a, of each of the switch SW13 and the switch SW14.

A terminal, b, of the switch SW13 is connected to the node ND22 of the reference voltage generating portion 123. That is to say, the first threshold voltage Vth1 as the voltage PstartV with which the electric power detection is started is supplied to the terminal, b, of the switch SW13.

The terminal, b, of the switch SW14 is connected to either the node ND23 or the node ND24 of the reference voltage generating portion 123 through the upper side threshold shifting functional portion 125.

That is to say, the second threshold voltage Vth2 as the voltage (PstartV+5 dB) corresponding to the voltage which is 5 dB higher than the voltage PstartV with which the electric power detection is started is supplied to the terminal, b, of the switch SW14. Or, the third threshold voltage Vth3 as the voltage (PstartV+10 dB) corresponding to the voltage which is 10 dB higher than the voltage PstartV with which the electric power detection is started is supplied to the terminal, b, of the switch SW14.

The switches SW13 and SW14 are each turned ON or OFF in a complementary style in accordance with the output signal from the comparator CMP12. Specifically, the switch SW14 is turned ON and the switch SW13 is turned OFF when the output control signal Vc2 from the comparator CMP12 is set at the H level. On the other hand, the switch SW14 is turned OFF and the switch SW13 is turned ON when the output control signal Vc2 from the comparator CMP12 is set at the L level.

In a phase of start of the detection, the comparator CMP12 compares the voltage signal S121 supplied to the inverting input terminal (−) thereof, and the second threshold voltage Vth2 supplied to the non-inverting input terminal (+) thereof with each other.

The comparator CMP12 outputs the control signal Vc2 set at the H level when the voltage signal S121 is lower than the second threshold voltage Vth2, and outputs the control signal Vc1 set at the L level when the voltage signal S121 is increased to exceed the second threshold voltage Vth2.

As a result, the switch SW14 is turned OFF, and the switch SW13 is turned ON.

The comparator CMP12 carries out an operation for comparing the first threshold voltage Vth1 as the voltage (PstartV−5 dB) corresponding to the voltage which is 5 dB lower than the second threshold voltage Vth2, and the voltage signal S121 after the level of the output signal has been inverted. The comparing operation using the first threshold voltage Vth1 is continuously carried out until the voltage signal S121 becomes lower than the first threshold voltage Vth1 and as a result, the level of the output signal from the comparator CMP12 is switched over to the H level.

An inverting input terminal (−) of the comparator CMP13 is connected to a supply line for the voltage signal S121 by the detector 121, and a non-inverting input terminal (+) thereof is connected to a terminal, a, of each of the switch SW15 and the switch SW16.

A terminal, b, of the switch SW15 is connected to the node ND23 of the reference voltage generating portion 123. That is to say, the second threshold voltage Vth2 as the voltage (PstartV+5 dB) corresponding to the voltage which is 5 dB higher than the voltage PstartV with which the electric power detection is started is supplied to the terminal, b, of the switch SW15.

A terminal, b, of the switch SW16 is connected to either the node ND24 or the node ND25 of the reference voltage generating portion 123 through the upper side threshold shifting functional portion 125.

That is to say, the third threshold voltage Vth3 as the voltage (PstartV+10 dB) corresponding to the voltage which is 10 dB higher than the voltage PstartV with which the electric power detection is started is supplied to the terminal, b, of the switch SW16. Or, the fourth threshold voltage Vth4 as the voltage (PstartV+15 dB) corresponding to the voltage which is 15 dB higher than the start voltage PstartV is supplied to the terminal, b, of the switch SW16.

The switches SW15 and SW16 are each turned ON or OFF in a complementary style in accordance with the output signal from the comparator CMP13. Specifically, the switch SW16 is turned ON and the switch SW15 is turned OFF when the output control signal Vc3 from the comparator CMP13 is set at the H level. On the other hand, the switch SW16 is turned OFF and the switch SW15 is turned ON when the output control signal Vc3 from the comparator CMP13 is set at the L level.

In a phase of start of the detection, the comparator CMP13 compares the voltage signal S121 supplied to the inverting input terminal (−) thereof, and the third threshold voltage Vth3 supplied to the non-inverting input terminal (+) thereof with each other.

The comparator CMP13 outputs the control signal Vc3 set at the H level when the voltage signal S121 is lower than the third threshold voltage Vth3, and outputs the control signal Vc3 set at the L level when the voltage signal S121 is increased to exceed the third threshold voltage Vth3.

As a result, the switch SW16 is turned OFF, and the switch SW15 is turned ON.

The comparator CMP13 carries out an operation for comparing the second threshold voltage Vth2 as the voltage (PstartV+5 dB) corresponding to the voltage which is 5 dB lower than the third threshold voltage Vth3, and the voltage signal S121 after the level of the output signal has been inverted. The comparing operation using the second threshold voltage Vth2 is continuously carried out until the voltage signal S121 becomes lower than the second threshold voltage Vth2 and as a result, the level of the output signal from the comparator CMP13 is switched over to the H level.

An inverting input terminal (−) of the comparator CMP14 is connected to a supply line for the voltage signal S121 by the detector 121, and a non-inverting input terminal (+) thereof is connected to a terminal, a, of each of the switch SW17 and the switch SW18.

A terminal, b of the switch SW17 is connected to the node ND24 of the reference voltage generating portion 123. That is to say, the third threshold voltage Vth3 as the voltage (PstartV+10 dB) corresponding to the voltage which is 10 dB higher than the voltage PstartV with which the electric potential detection is started.

A terminal, b, of the switch SW18 is connected to either the node ND25 or the node ND26 of the reference voltage generating portion 123 through the upper side threshold voltage shifting functional portion 125.

That is to say, the fourth threshold voltage Vth4 as the voltage (PstartV+15 dB) corresponding to the voltage which is 15 dB higher than the voltage PstartV with which the electric power detection is started is supplied to the terminal, b, of the switch SW18. Or, the fifth threshold voltage Vth5 as the voltage (PstartV+20 dB) corresponding to the voltage which is 20 dB higher than the start voltage PstartV is supplied to the terminal, b, of the switch SW18.

The switches SW17 and SW18 are each turned ON or OFF in a complementary style in accordance with the output signal from the comparator CMP14. Specifically, the switch SW18 is turned ON and the switch SW17 is turned OFF when the output control signal Vc4 from the comparator CMP14 is set at the H level. On the other hand, the switch SW18 is turned OFF and the switch SW17 is turned ON when the output control signal Vc4 from the comparator CMP14 is set at the L level.

In a phase of start of the detection, the comparator CMP14 compares the voltage signal S121 supplied to the inverting input terminal (−) thereof, and the fourth threshold voltage Vth4 supplied to the non-inverting input terminal (+) thereof with each other.

The comparator CMP14 outputs the control signal Vc4 set at the H level when the voltage signal S121 is lower than the fourth threshold voltage Vth4, and outputs the control signal Vc4 set at the L level when the voltage signal S121 is increased to exceed the fourth threshold voltage Vth4.

As a result, the switch SW18 is turned OFF, and the switch SW17 is turned ON.

The comparator CMP14 carries out an operation for comparing the third threshold voltage Vth3 as the voltage (PstartV+10 dB) corresponding to the voltage which is 5 dB lower than the fourth threshold voltage Vth4, and the voltage signal S121 with each other after the level of the output signal has been inverted. The comparing operation using the third threshold voltage Vth3 is continuously carried out until the voltage signal S121 becomes lower than the third threshold voltage Vth3 and as a result, the level of the output signal from the comparator CMP14 is switched over to the H level.

In the hysteresis comparator portion 124 having such a configuration, the inverting operation is carried out from the comparator CMP11 which carries out the comparing operation with the lowest threshold voltage as the output voltage from the detector 121 rises from 0 V.

Figure 6:
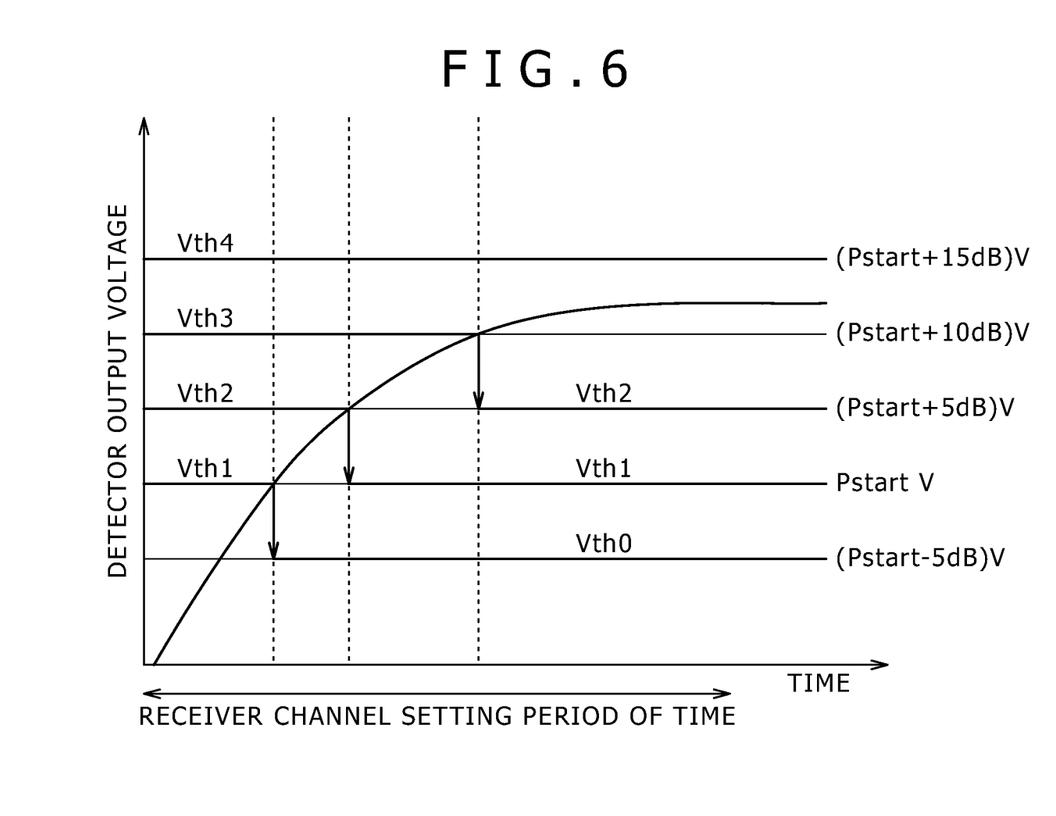
FIG. 6 is a graphical representation showing a situation in which thresholds of comparators in a hysteresis comparator portion in accordance with an output voltage from the detector.

FIG. 6 is a graphical representation showing a situation in which the threshold voltages of the respective comparators in the hysteresis comparator portion are changed in accordance with the output voltage from the detector.

FIG. 6 represents an example of the operations of the comparators CMP11 to CMP14 in the hysteresis comparator portion 124 by using a time axis. In addition, FIG. 6 shows an example of the operations when an upper side shifting function of the upper side threshold shifting functional portion 125 is not developed.

In this example, there is inputted the RF signal having such a level as to exceed each of the threshold voltages Vth1, Vth2, and Vth3 of the first three comparators CMP11 to CMP13 except for the comparator CMP14 in the four comparators CMP11 to CMP14 in total.

The moment the voltage signal S121 of the detector 121 exceed each of the threshold voltages Vth1, Vth2, and Vth3, the thresholds of the comparators CMP11 to CMP13 fall to the threshold voltages Vth0, Vth1, and Vth2 corresponding to the voltages which are 5 dB lower than the threshold voltages Vth1, Vth2, and Vth3, respectively.

As a result, an operation in which the comparator states return back to the original states, respectively, due to the presence of the noise or the like is prevented from being caused.

In the second embodiment, the control signals CTLs (Vc1 to Vc4) in accordance with which the attenuation for 15 dB is carried out for the step variable attenuator 122 are outputted from the hysteresis comparator portion 124.

2-5. Configuration of Upper Side (High-Level Side) Threshold Shifting Functional Portion FIG. 7 is a graphical representation showing a situation in which the thresholds of the comparators of the hysteresis comparator portion are changed in accordance with the output voltage from the detector in the case where the upper side threshold shifting functional portion 125 has an upper side (high-level side) threshold shifting function.

Figure 8:
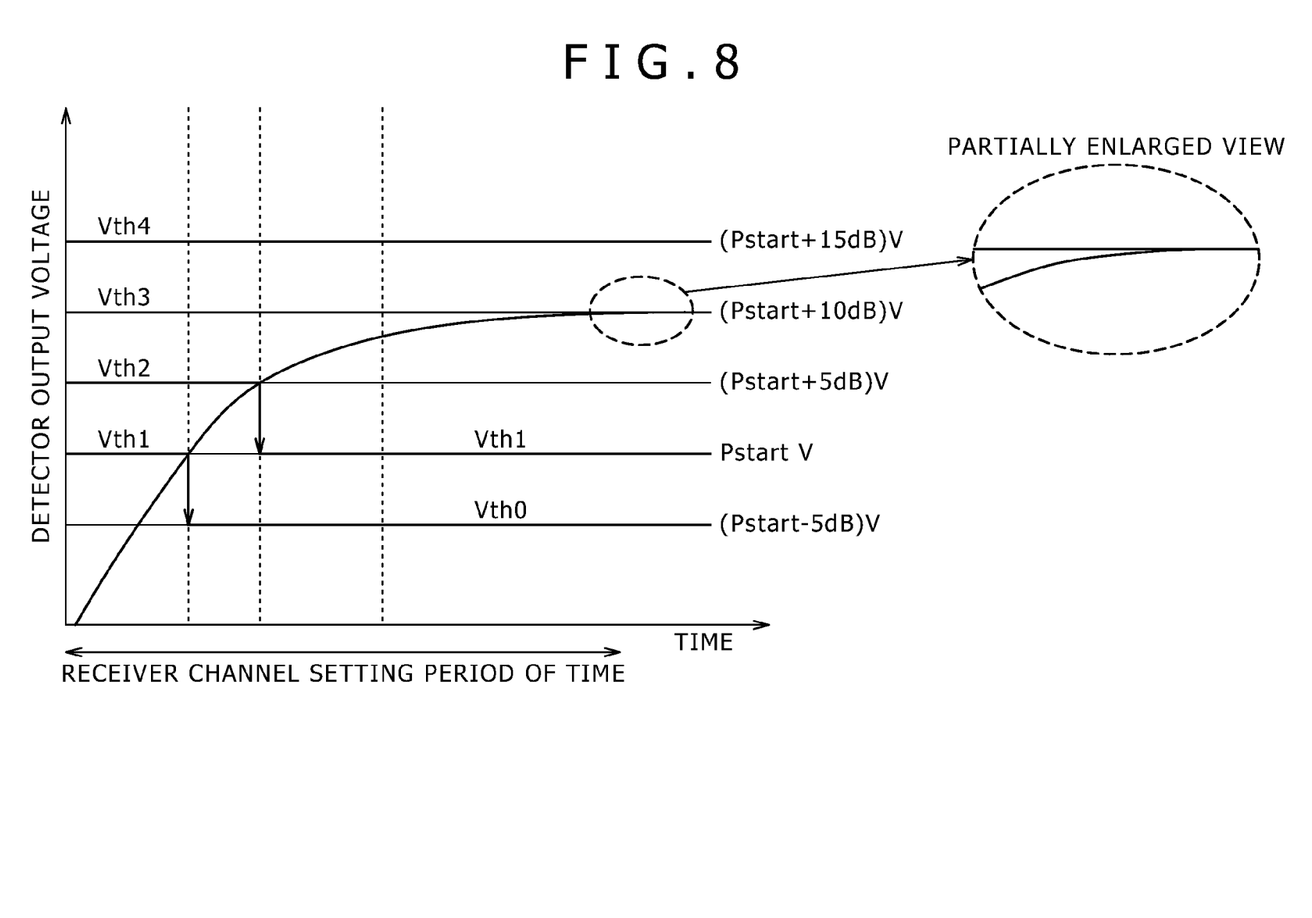
FIG. 8 is a graphical representation explaining the case where the upper side (high-level side) threshold shifting function is necessary.

FIG. 8 is a graphical representation explaining the case where the upper side (high-level side) threshold shifting function is required.

Figure 7:
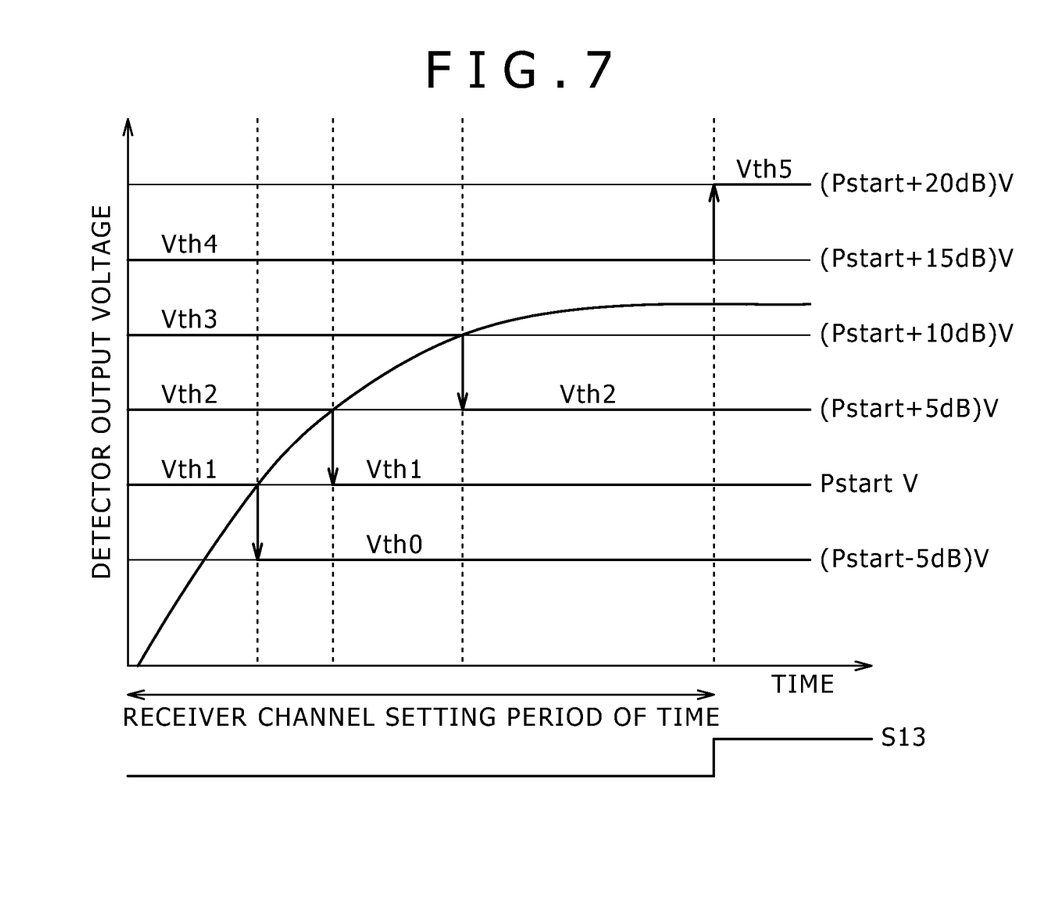
FIG. 7 is a graphical representation showing a situation in which the thresholds of the comparators in the hysteresis comparator portion in accordance with the output voltage from the detector in the case where the automatic step variable attenuator has an upper side (high-level side) threshold shifting function.

The upper side threshold shifting functional portion 125 has a function in which as shown in FIG. 7, when an upper side threshold shift signal S13 set at the high level is received, the threshold voltage Vth of the comparator whose output signal is not inverted in the hysteresis comparator portion 124 is switched over to a high-level threshold.

The upper side threshold shifting functional portion 125 shifts the threshold voltage Vth of the comparator whose output signal is not inverted to the threshold voltage corresponding to the voltage which is 5 dB higher than the threshold voltage before the shift.

In the second embodiment (in the case shown in FIG. 6), in the hysteresis comparator portion 124, the output signals from the three comparators CMP11 to CMP13 are inverted, and thus the threshold voltages of the three comparators CMP11 to CMP13 are shifted from Vth1, Vth2, and Vth3 to the lower threshold voltages Vth0, Vth1, and Vth2, respectively.

Also, in the case described above, the output signal from the comparator CMP14 is not inverted.

When the upper side threshold shift signal S13 set at the high level has been received in this state, the upper side threshold shifting functional portion 125 shifts the fourth threshold voltage Vth4 of the comparator CMP14 to the fifth threshold voltage Vth5 corresponding to the voltage which is 5 dB higher than the fourth threshold voltage Vth4 of the comparator CMP14.

The reason why the upper side threshold shifting function is mounted will be given below.

A hysteresis margin of 5 dB or more is usually obtained for the lower side (low-level side) threshold by the hysteresis operation for shifting the threshold voltage of the comparator whose output signal is inverted to the threshold voltage corresponding to the voltage which is 5 dB lower than the threshold voltage concerned with respect to the threshold voltages within the hysteresis comparator portion 124.

For this reason, even when some change as the input level reduction of the RF signal is generated, the output signal from the comparator is prevented from returning back to original one. As shown in FIG. 8, however, there is no hysteresis margin in any of the upper side thresholds.

For this reason, when some RF signal input level increase is generated after the receiver channel setting period of time, it is possible that the switching is caused in the step variable attenuator 122. In this case, the image noise is generated in the manner described above.

In the example shown in FIG. 8, when a state is held in which the convergence is made at the voltage which does not barely reach the third threshold voltage Vth3, the possibility that the third threshold Vth3 of the comparator CMP13 is exceeded due to the superposition of a minute noise is large.

In addition, there is known a receiving system in which the image noise is generated when the switching operation of the step variable attenuator 122 is generated during the reception.

Then, for the purpose of preventing the malfunction due to the noise, the upper side threshold shifting function is mounted.

For the receiver channel setting period of time, the upper side threshold shift signal S13 is set at the low level to hold the upper side threshold shifting function in the OFF state, and thus the operation of the system is the same as that described above.

After completion of the receiver channel setting period of time, a signal representing the completion of the receiver channel setting period of time is inputted from the outside to set the upper side threshold shift signal S13 at the high level, thereby holding the upper side threshold shifting function in the ON state.

In this case, the threshold voltage of the comparator CMP14 whose output signal is not yet inverted is shifted to the threshold voltage which is 5 dB higher than the threshold voltage concerned.

As a result, the hysteresis margin is obtained on the upper side (high-level side) as well, and thus a state is obtained in which the step attenuator switching is not generated for the objective RF signal input increase/decrease.

The upper side threshold shifting functional portion 125 shown in FIG. 2 includes switches SW21 to SW28.

When the upper side threshold shift signal S13 is held at the L level, the switches SW21, SW23, SW25, and SW27 are each held in the ON state, and the switches SW22, SW24, SW26, and SW28 are each held in the OFF state.

On the other hand, when the upper side threshold shift signal S13 is held at the H level, the switches SW21, SW23, SW25, and SW27 are each switched over to the OFF state, and the switches SW22, SW24, SW26, and SW28 are each switched over to the ON state.

As far as the connection concerned, a terminal, a, of each of the switches SW21 and SW22 is connected to the terminal, b, of the switch SW12 in the hysteresis comparator portion 124.

A terminal, b, of the switch SW21 is connected to the node ND22 at which the first threshold voltage Vth1 as the voltage (PstartV) of the reference voltage generating portion 123 is developed.

A terminal, b, of the switch SW22 is connected to the node ND23 at which the second threshold voltage Vth2 as the voltage (PstartV+5 dB) is developed.

A terminal, a, of each of the switches SW23 and SW24 is connected to the terminal, b, of the switch SW14 in the hysteresis comparator portion 124.

A terminal, b, of the switch SW23 is connected to the node ND23 at which the second threshold voltage Vth2 as the voltage (PstartV+5 dB) of the reference voltage generating portion 123 is developed.

A terminal, b, of the switch SW24 is connected to the node ND24 at which the third threshold voltage Vth3 as the voltage (PstartV+10 dB) is developed.

A terminal, a, of each of the switches SW25 and SW26 is connected to the terminal, b, of the switch SW16 in the hysteresis comparator portion 124.

A terminal, b, of the switch SW25 is connected to the node ND24 at which the third threshold voltage Vth3 as the voltage (PstartV+10 dB) of the reference voltage generating portion 123 is developed.

A terminal, b, of the switch SW26 is connected to the node ND25 at which the fourth threshold voltage Vth4 as the voltage (PstartV+15 dB) is developed.

A terminal, a, of each of the switches SW27 and SW28 is connected to the terminal, b, of the switch SW18 in the hysteresis comparator portion 124.

A terminal, b, of the switch SW27 is connected to the node ND25 at which the fourth threshold voltage Vth4 as the voltage (PstartV+15 dB) of the reference voltage generating portion 123 is developed.

A terminal, b, of the switch SW28 is connected to the node ND26 at which the fifth threshold voltage Vth5 as the voltage (PstartV+20 dB) is developed.

As described above, in the example shown in FIG. 6, in the hysteresis comparator portion 124, the output signals from the three comparators CMP11 to CMP13 are each inverted, and thus the threshold voltages of the three comparators CMP11 to CMP13 are shifted from Vth1, Vth2, and Vth3 to the lower-side threshold voltages Vth0, Vth1, and Vth2, respectively.

Also, in the example shown in FIG. 6, the output signal from the comparator CMP4 is not inverted.

When the upper side threshold shift signal S13 set at the high level has been received in the state, the upper side threshold shifting functional portion 125 switches the switches SW22, SW24, SW26, and SW28 over to the ON state.

At this time, the switches SW12, SW14, and SW16 of the hysteresis comparator portion 124 as connection destinations of the switches SW22, SW24, and SW26 of the hysteresis comparator portion 124 are each held in the OFF state, and only the switch SW18 of the hysteresis comparator portion 124 as a connection destination of the switch SW28 is held in the ON state.

As a result, the fourth threshold voltage Vth4 of the comparator CMP14 is shifted to the fifth threshold voltage Vth5 corresponding to the voltage which is 5 dB higher than the fourth threshold voltage Vth4.

Next, a description will be given with respect to an operation of the automatic step variable attenuator 12 having the configuration described above.

Firstly, the RF signal (radio received signal) received through the antenna 11 is converted into the different signal S121 representing the intensity of the RF signal such as the voltage or the current in the detector 121.

As shown in FIG. 3, the voltage signal S121 which is monotonously increased because it is originated from the RF signal is outputted from the detector 121.

As far as an operation of the detector 121 concerned, the output signal from the detector 121 is approximately the voltage of 0 V before application of the RF signal, and the output signal is increased from the moment the RF signal is inputted in accordance with the built-in time constant.

Here, since the feedback system is not adopted, the RF signal inputted to the detector 121 is not changed in the step-like style.

In the reference voltage generating portion 123, the threshold voltage as the reference voltage used to give the voltage for comparison in the hysteresis comparator portion 124 is generated in the style of a fixed current with a resistive element.

At this time, each of the threshold voltages is previously set so as to represent a desired electric power in correspondence to the conversion characteristics of the detector 121.

In the example concerned, the voltages are decided so as to become the 5 dB-step thresholds in the RF signal electric power.

The output voltage signal S121 from the detector 121 is inputted to the hysteresis comparator portion 124.

In the hysteresis comparator portion 124, the inverting operation is carried out from the comparator having the lowest threshold voltage as the detector output voltage rises from 0 V.

For example, in the example shown in FIG. 6, the RF signal having such a level as to exceed each of the threshold voltages Vth1 to Vth3 is inputted up to each of the first three comparators CMP11 to CMP13 of the four comparators CMP11 to CMP14 in total.

The moment the threshold voltages Vth1 to Vth3 are each exceeded, the threshold voltages Vth1 to Vth3 of the comparators CMP11 to CMP13 are each reduced by 5 dB. As a result, the operation in which the comparator states return back to the original states, respectively, due to the presence of the noise or the like is prevented from being carried out.

The control signals CTLs (Vc1 to Vc4) in accordance which the attenuation for 15 dB is carried out are outputted from the hysteresis comparator portion 124 to the step variable attenuator 122.

The step variable attenuator 122 composes the so-called π type resistive attenuator. Thus, the suitable resistive value is selected in such a way that in any state, an input impedance becomes constant and an attenuation amount is obtained in a 5 dB step style.

For example, in the example shown in FIG. 6, the step variable attenuator 122 is operated in such a way that the step attenuation value for 15 dB is finally obtained.

With the step variable attenuator 122, even when the RF input signal having the excessively large magnitude is inputted to the system, the level of the signal which is outputted to the low-noise variable amplifier 14 in the subsequent stage is adjusted in the range within 5 dB in the step variable range.

The suitable time constant in the detector 121 is selected in such a way that all of the operations described above are completed for the receiver channel setting period of time.

The description described above is a description of the operation when the upper side threshold shifting function is not developed.

When the upper side threshold shifting function is developed, the upper side threshold shift signal S13 set at the high level is supplied to the upper side threshold shifting functional portion 125.

When the upper side threshold shifting functional portion 125 has received the upper side threshold shift signal S13 set at the high level, the hysteresis comparator portion 124 switches the threshold voltage Vth of the comparator whose output signal is not inverted over to the high-level side threshold voltage.

The upper side threshold shifting functional portion 125 shifts the threshold voltage Vth of the comparator whose output signal is not inverted to the threshold voltage corresponding to the voltage which is 5 dB higher than the threshold voltage before the shift.

In each of the examples shown in FIGS. 6 and 7, in the hysteresis comparator portion 124, the output signals from the three components CMP11 to CMP13 are each inverted, and thus the threshold voltages of the three components CMP11 to CMP13 are shifted from the threshold voltages Vth1, Vth2, and Vth3 to the lower-side threshold voltages Vth0, Vth1, and Vth2, respectively.

Also, the output signal from the comparator CMP14 is not inverted.

When the upper side threshold shift signal S13 set at the high level has been received in this state, the upper side threshold shifting functional portion 125 shifts the fourth threshold voltage Vth4 of the comparator CMP14 to the fifth threshold voltage Vth5 corresponding to the voltage which is 5 dB higher than the fourth threshold voltage Vth4 of the comparator CMP14.

As a result, the hysteresis margin is obtained for the upper side as well, and thus the state is obtained in which the step attenuator switching is not generated for the objective RF signal input increase/decrease.

As described above, according to the first and second embodiments of the present disclosure, since the feed forward system is adopted for the step control for the step variable attenuator, the convergence time of the system, that is, the final decision time of the step attenuation amount can be simply decided in accordance with the selection through the selection of the detector time constant.

That is to say, the radio communication device 10 of the first embodiment, for example, has the variable gain dynamic range of 80 dB or more in total by including the three variable gain elements, and can maintain the optimal output level for the input signal level having the wide range.

In addition, the automatic step variable attenuator 12 composed of the passive elements is mounted to an input portion of the radio communication device 10. As a result, when the large interfering wave is inputted, the signal inputted to the low-noise variable amplifier 14 composed of the active element which is easy to generate the distortion can be reduced without generating any of the distortions.

In addition, it is possible to realize the automatic step variable attenuator such that since the hysteresis margin is suitably ensured, the generation of the step attenuation switching can be prevented for some change in the RF signal after completion of the receiver channel setting period of time.

It is noted that the present disclosure can adopt the following constitutions.

(1) An automatic step variable attenuator including:
a step variable attenuator attenuating a received signal of an electric wave signal in an attenuation amount corresponding to a control signal in a step-like style;
a detector disposed in parallel with the step variable attenuator for input of the received signal of the electric wave signal, and converting an electric power of the received signal thus inputted into an intensity signal representing an intensity of the received signal; and
a comparator portion generating the control signal corresponding to a result of comparison for differences between the intensity signal obtained from the detector and plural threshold values, and outputting the control signal thus generated to the step variable attenuator.

(2) The automatic step variable attenuator described in the paragraph (1), in which the comparator portion includes plural comparators comparing thresholds whose values are different from one another in a step-like style, and the intensity signal with one another, and carries out a comparing operation in such a way that an output signal is inverted from the comparator comparing the lowest threshold for comparison start, and the intensity signal with each other, and the lowest threshold of the comparator whose output signal is inverted is switched over to a threshold lower than the threshold which is used in the first comparison.

(3) The automatic step variable attenuator described in the paragraph (1) or (2), in which the intensity signal is a signal which is basically monotonously increased;
the comparator portion includes plural comparators comparing thresholds whose values are different from one another in a step-like style, and the intensity signal with one another;
each of the plural components outputs the control signal set at a first level when the intensity signal does not exceed a threshold for comparison start given so as to correspond thereto, and outputs the control signal set at a second level obtained by inverting the first level when the intensity signal exceeds the threshold for comparison start; and
compares a threshold which is given so as to be substituted for the threshold for comparison start, and which is at least one step lower than the threshold for comparison start, and the intensity signal when the control signal set at the second level is outputted.

(4) The automatic step variable attenuator described in the paragraph (2) or (3), further including:
a threshold shifting functional portion shifting the thresholds for comparison start of the comparators to thresholds which are higher than the thresholds for comparison start, respectively.

(5) The automatic step variable attenuator described in the paragraph (4), in which the threshold shifting functional portion shifts the threshold(s) of the comparator(s) whose output signal(s) is(are) not inverted of the plural comparators as a result of comparing the intensity signal and the thresholds for comparison start with one another to the threshold(s) which is(are) higher than the threshold(s) of the comparator(s) whose output signal(s) is(are) not inverted.

(6) A radio communication device including:
an automatic step variable attenuator attenuating a received signal of an electric wave signal in a step-like style; and
a low-noise amplifier amplifying a received signal outputted from said automatic step variable attenuator with a predetermined gain, the automatic step variable attenuator including:
a step variable attenuator attenuating the received signal of the electric wave signal in an attenuation amount corresponding to a control signal in a step-like style, and outputting the resulting received signal to the low-noise amplifier;
a detector disposed in parallel with the step variable attenuator for input of the received signal of the electric wave signal, and converting an electric power of the received signal thus inputted into an intensity signal representing an intensity of the received signal; and
a comparator portion generating the control signal corresponding to a result of comparison for differences between the intensity signal obtained from the detector and plural threshold values, and outputting the control signal thus generated to said step variable attenuator.

(7) The radio communication device described in the paragraph (6), in which the comparator portion includes plural comparators comparing thresholds whose values are different from one another in a step-like style, and the intensity signal with one another, and carries out a comparing operation in such a way that an output signal is inverted from the comparator comparing the lowest threshold for comparison start, and the intensity signal with each other, and the lowest threshold of the comparator whose output signal is inverted is switched over to a threshold lower than the threshold which is used in the first comparison.

(8) The radio communication device described in the paragraph (6) or (7), in which the intensity signal is a signal which is basically monotonously increased;
the comparator portion includes plural comparators comparing thresholds whose values are different from one another in a step-like style, and the intensity signal with one another;
each of the plural components outputs the control signal set at a first level when the intensity signal does not exceed a threshold for comparison start given so as to correspond thereto, and outputs the control signal set at a second level obtained by inverting the first level when the intensity signal exceeds the threshold for comparison start; and
compares a threshold which is given so as to be substituted for the threshold for comparison start, and which is at least one step lower than the threshold for comparison start, and the intensity signal when the control signal set at the second level is outputted.

(9) The radio communication device described in the paragraph (7) or (8), further including:
a threshold shifting functional portion shifting the thresholds for comparison start of the comparators to thresholds which are higher than the thresholds for comparison start, respectively.

(10) The radio communication device described in the paragraph (9), in which the threshold shifting functional portion shifts the threshold(s) of the comparator(s) whose output signal(s) is(are) not inverted of the plural comparators as a result of comparing the intensity signal and the thresholds for comparison start with one another to the threshold(s) which is(are) higher than the threshold(s) of the comparator(s) whose output signal(s) is(are) not inverted.

The present disclosure contains subject matter related to that disclosed in Japanese Priority Patent Application JP 2011-171202 filed in the Japan Patent Office on Aug. 4, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An automatic step variable attenuator comprising:
a step variable attenuator attenuating a received signal of an electric wave signal in an attenuation amount corresponding to a control signal in a step-like style;
a detector disposed in parallel with the step variable attenuator for input of the received signal of the electric wave signal, and converting an electric power of the received signal thus inputted into an intensity signal representing an intensity of the received signal; and
a comparator portion generating the control signal corresponding to a result of comparison for differences between the intensity signal obtained from the detector and plural threshold values, and outputting the control signal thus generated to the step variable attenuator, wherein the comparator portion
includes plural comparators comparing thresholds whose values are different from one another in the step-like style, and the intensity signal with one another, and
carries out a comparing operation in such a way that an output signal is inverted from the comparator comparing a lowest threshold for comparison start, and the intensity signal with each other, and the lowest threshold of the comparator whose output signal is inverted is switched over to a threshold lower than the threshold which is used in first comparison.

2. The automatic step variable attenuator according to claim 1, wherein
the intensity signal is a signal which is basically monotonously increased; and
each of said plural comparators
outputting the control signal set at a first level when the intensity signal does not exceed the threshold for comparison start given so as to correspond thereto, and outputting the control signal set at a second level obtained by inverting the first level when the intensity signal exceeds the threshold for comparison start, and
comparing a threshold which is given so as to be substituted for the threshold for comparison start, and which is at least one step lower than the threshold for comparison start, and the intensity signal when the control signal set at the second level is outputted.

3. The automatic step variable attenuator according to claim 1, further comprising:
a threshold shifting functional portion shifting the thresholds for comparison start of the comparators to thresholds which are higher than the thresholds for comparison start, respectively.

4. The automatic step variable attenuator according to claim 3, wherein said threshold shifting functional portion shifts the threshold of the comparator whose output signal is not inverted of said plural comparators as a result of comparing the intensity signal and the thresholds for comparison start with one another to the threshold which is higher than the threshold of the comparator whose output signal is not inverted.

5. A radio communication device comprising:
an automatic step variable attenuator attenuating a received signal of an electric wave signal in a step-like style; and
a low-noise amplifier amplifying a received signal outputted from the automatic step variable attenuator with a predetermined gain,
wherein the automatic step variable attenuator including
a step variable attenuator attenuating the received signal of the electric wave signal in an attenuation amount corresponding to a control signal in the step-like style, and outputting the resulting received signal to the low-noise amplifier,
a detector disposed in parallel with the step variable attenuator for input of the received signal of the electric wave signal, and converting an electric power of the received signal thus inputted into an intensity signal representing an intensity of the received signal, and
a comparator portion generating the control signal corresponding to a result of comparison for differences between the intensity signal obtained from the detector and plural threshold values, and outputting the control signal thus generated to the step variable attenuator, wherein the comparator portion
includes plural comparators comparing thresholds whose values are different from one another in the step-like style, and the intensity signal with one another, and
carries out a comparing operation in such a way that an output signal is inverted from the comparator comparing a lowest threshold for comparison start, and the intensity signal with each other, and the lowest threshold of the comparator whose output signal is inverted is switched over to a threshold lower than the threshold which is used in first comparison.

6. The radio communication device according to claim 5, wherein
the intensity signal is a signal which is basically monotonously increased; and
each of said plural comparators
outputting the control signal set at a first level when the intensity signal does not exceed the threshold for comparison start given so as to correspond thereto, and outputting the control signal set at a second level obtained by inverting the first level when the intensity signal exceeds the threshold for comparison start, and
comparing a threshold which is given so as to be substituted for the threshold for comparison start, and which is at least one step lower than the threshold for comparison start, and the intensity signal when the control signal set at the second level is outputted.

7. The radio communication device according to claim 5, further comprising:
a threshold shifting functional portion shifting the thresholds for comparison start of the comparators to thresholds which are higher than the thresholds for comparison start, respectively.

8. The radio communication device according to claim 7, wherein said threshold shifting functional portion shifts the threshold of the comparator whose output signal is not inverted of said plural comparators as a result of comparing the intensity signal and the thresholds for comparison start with one another to the threshold which is higher than the threshold of the comparator whose output signal is not inverted.

9. An automatic step variable attenuator comprising:
a step variable attenuator attenuating a received signal of an electric wave signal in an attenuation amount corresponding to a control signal in a step-like style;
a detector disposed in parallel with the step variable attenuator for input of the received signal of the electric wave signal, and converting an electric power of the received signal thus inputted into an intensity signal representing an intensity of the received signal;
a comparator portion generating the control signal corresponding to a result of comparison for differences between the intensity signal obtained from the detector and plural threshold values, and outputting the control signal thus generated to the step variable attenuator; and
a threshold shifting functional portion shifting thresholds for comparison start of plural comparators, included in the comparator portion, to thresholds which are higher than the thresholds for comparison start, respectively.

10. An automatic step variable attenuator comprising:
a step variable attenuator attenuating a received signal of an electric wave signal in an attenuation amount corresponding to a control signal in a step-like style;
a detector disposed in parallel with the step variable attenuator for input of the received signal of the electric wave signal, and converting an electric power of the received signal thus inputted into an intensity signal representing an intensity of the received signal; and
a comparator portion generating the control signal corresponding to a result of comparison for differences between the intensity signal obtained from the detector and plural threshold values, and outputting the control signal thus generated to the step variable attenuator, wherein the intensity signal is a signal which is basically monotonously increased, wherein the comparator portion comprises plural comparators comparing thresholds whose values are different from one another in the step-like style, and the intensity signal with one another, and wherein each of the plural comparators:
outputs the control signal set at a first level when the intensity signal does not exceed a threshold for comparison start given so as to correspond thereto, and outputs the control signal set at a second level obtained by inverting the first level when the intensity signal exceeds the threshold for comparison start, and
compares a threshold which is given so as to be substituted for the threshold for comparison start, and which is at least one step lower than the threshold for comparison start, and the intensity signal when the control signal set at the second level is outputted.

* * * * *